United States Patent
Higashi et al.

(10) Patent No.: US 7,646,095 B2
(45) Date of Patent: Jan. 12, 2010

(54) SEMICONDUCTOR DEVICE

(75) Inventors: Kazushi Higashi, Neyagawa (JP);
Kouichi Yoshida, Kawasaki (JP); Shinji Ishitani, Akashi (JP); Daido Komyoji, Ikoma (JP)

(73) Assignee: Panasonic Corporation, Osaka (JP)

( * ) Notice: Subject to any disclaimer, the term of this patent is extended or adjusted under 35 U.S.C. 154(b) by 373 days.

(21) Appl. No.: 10/946,372

(22) Filed: Sep. 21, 2004

(65) Prior Publication Data

US 2005/0104173 A1    May 19, 2005

(30) Foreign Application Priority Data

Sep. 30, 2003 (JP) ............... 2003-340456

(51) Int. Cl.
 H01L 23/48 (2006.01)
 H01L 23/52 (2006.01)
 H01L 23/40 (2006.01)
(52) U.S. Cl. .............. 257/738; 257/783; 257/779; 257/792; 257/E23.021; 257/E23.193
(58) Field of Classification Search ........... 257/783, 257/782, E23.007, 734, 737, 779, E23.021, 257/E23.193
See application file for complete search history.

(56) References Cited

U.S. PATENT DOCUMENTS

| | | | | | |
|---|---|---|---|---|---|
| 4,266,239 | A | * | 5/1981 | Miyagaki et al. ........... | 257/664 |
| 4,580,157 | A | * | 4/1986 | Honda ........................ | 257/660 |
| 4,927,697 | A | * | 5/1990 | Hill ............................ | 428/198 |
| 5,119,171 | A | * | 6/1992 | Lesk et al. .................. | 257/623 |
| 5,438,859 | A | * | 8/1995 | Yamashita et al. .......... | 73/1.38 |
| 6,184,062 | B1 | * | 2/2001 | Brofman et al. ............. | 438/106 |
| 6,201,696 | B1 | * | 3/2001 | Shimizu et al. ............. | 361/704 |
| 6,289,732 | B1 | * | 9/2001 | Murari et al. ................ | 73/493 |
| 6,388,339 | B1 | | 5/2002 | Yamamoto et al. | |
| 6,635,971 | B2 | * | 10/2003 | Asada et al. ................ | 257/789 |
| 6,642,626 | B2 | * | 11/2003 | Park .......................... | 257/778 |
| 6,695,985 | B2 | * | 2/2004 | Igarashi et al. ........... | 252/518.1 |
| 7,138,653 | B1 | * | 11/2006 | Akram ....................... | 257/48 |
| 7,224,071 | B2 | * | 5/2007 | Odegard ..................... | 257/778 |
| 2001/0014523 | A1 | * | 8/2001 | Bessho ....................... | 438/613 |
| 2002/0198286 | A1 | | 12/2002 | Igarashi et al. | |
| 2003/0011069 | A1 | * | 1/2003 | Shibata ...................... | 257/734 |

FOREIGN PATENT DOCUMENTS

| | | |
|---|---|---|
| CN | 1303086 A | 7/2001 |
| JP | 03044046 A | 2/1991 |
| JP | 03293740 A | 12/1991 |
| JP | 3293740 B2 | 12/1991 |
| JP | 6-31144 U | 4/1994 |
| JP | 10340923 A | 12/1998 |
| JP | 2000100877 A | 4/2000 |

* cited by examiner

*Primary Examiner*—Walter L Lindsay, Jr.
*Assistant Examiner*—Ron Pompey
(74) *Attorney, Agent, or Firm*—Panitch Schwarze Belisario & Nadel LLP

(57) ABSTRACT

In a semiconductor device of the present invention, in order that the contact of electrodes formed on a film substrate with edge parts of a semiconductor element at the time such as when the semiconductor element is mounted thereon may be reliably prevented, in the semiconductor element mounted on at least one surface of the film substrate having the electrodes, an insulating protection part is formed at a desired position of the surface opposed to the electrodes, and the distance between the semiconductor element and the film substrate is set at not less than 10 μm.

8 Claims, 20 Drawing Sheets

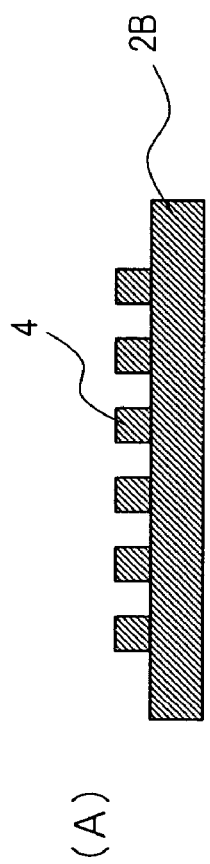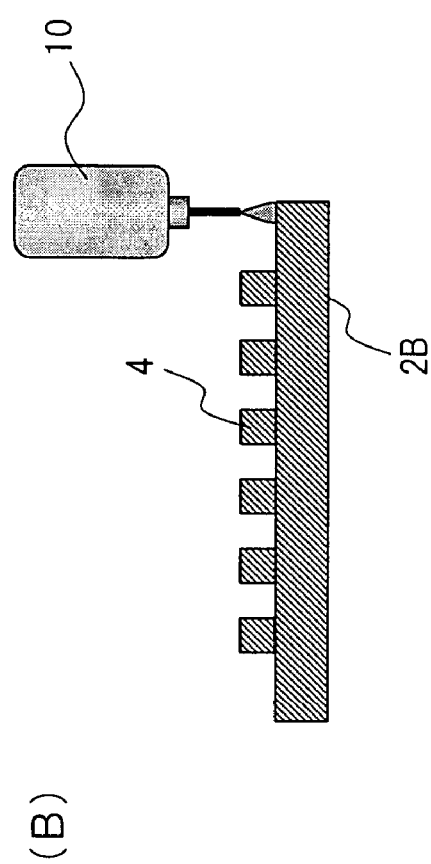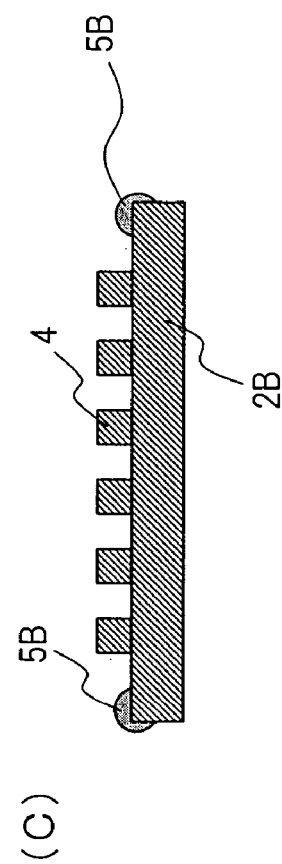
FIG. 6

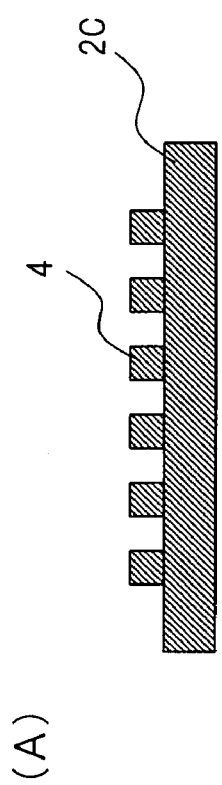
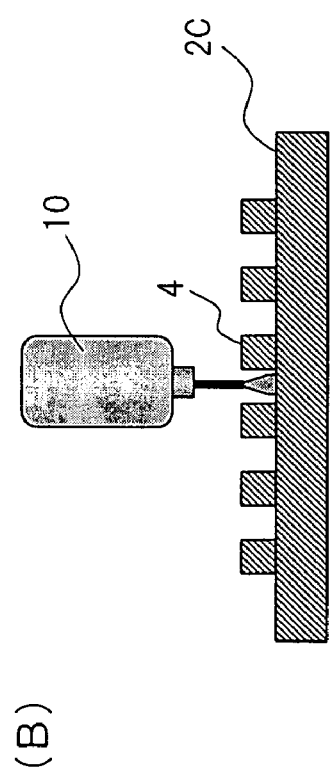
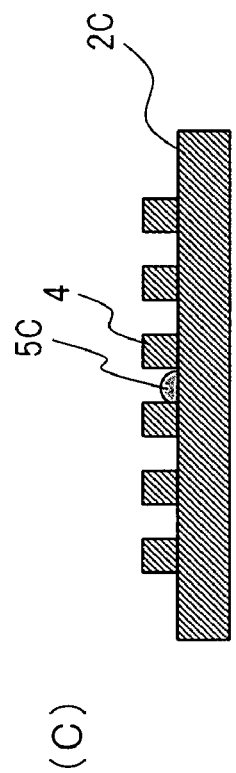
FIG. 8

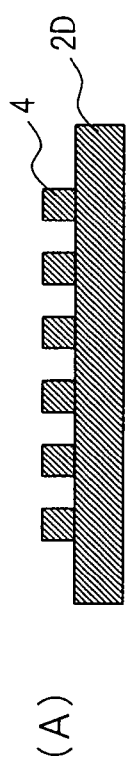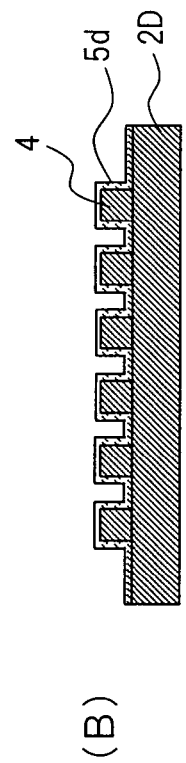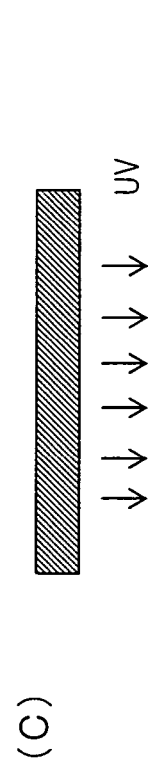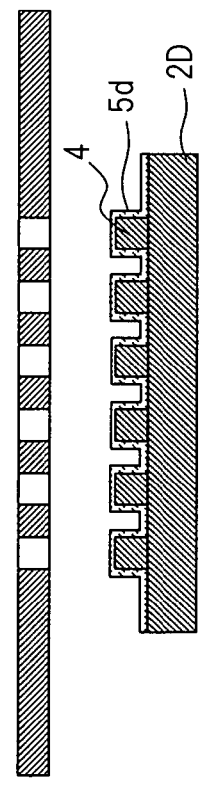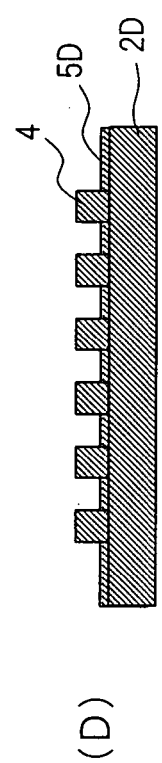
FIG. 10

F I G. 1 4
(a) 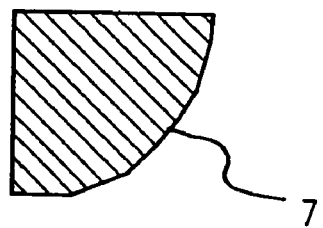
(b) 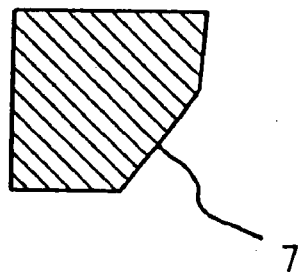

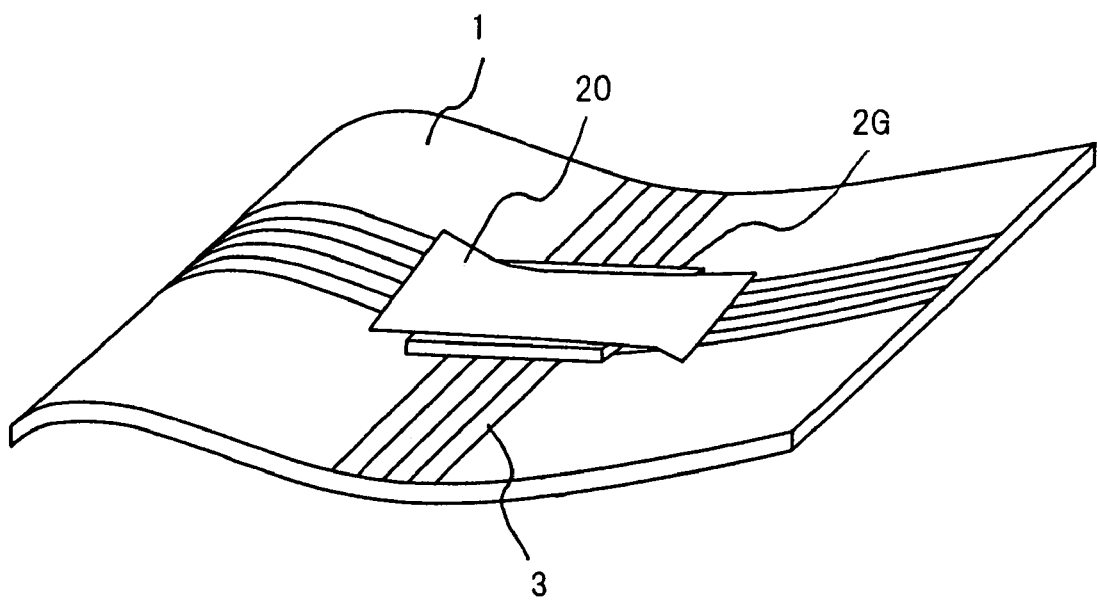
F I G. 1 7

SEMICONDUCTOR DEVICE

BACKGROUND OF THE INVENTION

The present invention relates to a semiconductor device and a manufacturing method thereof wherein a semiconductor element is mounted on a film-shaped substrate having flexibility.

A semiconductor element is mounted on a film substrate which is a film-shaped substrate used in cellular phones and digital cameras, and is molded with a resin. As a method of mounting the semiconductor element on the film substrate, TAB (Tape Automated Bonding) method is known. In the TAB method, a hole for mounting an element is formed in the film substrate, and by laminating metal foil to a surface of the film substrate and etching the metal foil, a plurality of finger leads which project inside the hole are formed. Bump electrodes of the semiconductor element are welded to these finger leads, and the semiconductor element is thereby mounted on the film substrate.

A conventional semiconductor device having the configuration as mentioned above has a problem that, when the bump electrodes of the semiconductor element are welded to the finger leads of the film substrate, the finger lead contacts a corner of the semiconductor element to be scratched or to be potentially short-circuited. To solve such a problem, some semiconductor devices are provided with an insulating film. FIG. 20 is a cross-sectional view of a semiconductor device disclosed in Official Gazette of Japanese Unexamined Patent Publication Hei 10-340923. The semiconductor device shown in FIG. 20 represents a state where a semiconductor element 101 is mounted on a film substrate 103 by the TAB method. In this semiconductor device, bump electrodes 105 of the semiconductor element 101 are fixed to finger leads 104 which project inside a hole 100 formed in the film substrate 103 by thermocompression bonding. An insulating film 102 formed on the bump-electrode side of the semiconductor element 101 is made by applying an insulating resin to a semiconductor wafer to form the semiconductor element 101 by spin coating and drying the applied resin. Since the bump electrodes 105 formed on the semiconductor wafer are covered with the insulating film 102 at this time, the whole surface of the insulating film 102 is half-etched. Consequently, the insulating film 102 is removed to the intermediate of the film thickness, so that the bump electrodes 105 project upward from the insulating film 102. The insulating film 102 at this time is set to have a thickness of 80% to 90% of the height of the bump electrodes. In the semiconductor wafer on which the insulating film 102 is formed as mentioned above, a groove for cutting is formed by etching. The semiconductor wafer is cut along this groove, and individual semiconductor elements 101 are thereby produced.

Since the insulating film 102 is formed on the bump-electrode side of the semiconductor element 101 as mentioned above, the situation is prevented wherein, when the finger leads 104 are welded to the bump electrode 105, the finger lead 104 directly contacts an edge part of the semiconductor element 101 and a short circuit thereby occurs. After the semiconductor element 101 is mounted on the film substrate 103 as mentioned above, the junctions of the bump electrodes 105 and the finger leads 104 are molded with a resin 106.

In the conventional semiconductor device shown in FIG. 20, the hole 100 for mounting the semiconductor element 101 is formed in the film substrate 103, and molding is done by filling this hole 100 with the resin 106. However, in some recent semiconductor devices, the hole 100 for mounting the semiconductor element 101 is not formed in the film substrate 103, but the configuration is employed wherein the bump electrodes 105 of the semiconductor element 101 are directly connected to the electrodes formed on the film substrate. In a semiconductor device having the configuration as mentioned above, the bump electrodes 105 of the semiconductor element 101 are placed on the electrodes formed on the film substrate, and the electrodes and the bump electrodes 105 are connected by thermocompression bonding. The semiconductor device is manufactured by filling the space between the semiconductor element 101 and the film substrate 103 configured as mentioned above with the resin.

When a semiconductor device is manufactured by filling the space between the semiconductor element 101 and the film substrate 103 with the resin, the space between the semiconductor element and the film substrate has to be completely filled with the molding resin so that the resin may not include a cavity, an air bubble or the like. A cavity, an air bubble or the like inside the resin, if any, becomes a cause of corrosion, breakage, disconnection and so on when the semiconductor device is used for a long time.

However, in the conventional semiconductor device, when the insulating film is formed between the semiconductor element 101 and the film substrate 103 for the purpose of the prevention of, for example, the short circuit which occurs when the semiconductor element 101 is mounted thereon, there is only a little space between the insulating film 102 of the semiconductor element 101 and the film substrate 103, and it is difficult to fill the space completely with the resin with no air bubble included in the space. Especially, as a pitch between electrodes becomes smaller and a space to be filled becomes narrower, the possibility that a cavity or an air bubble may be produced within the resin may be increased in the case where such a space is filled with the resin.

BRIEF SUMMARY OF THE INVENTION

The present invention is made in view of the problems in the conventional configuration, and has the object to provide a semiconductor device and a manufacturing method thereof, which has a configuration wherein the direct contact of electrodes formed on a film substrate with edge parts of a semiconductor element at the time the semiconductor element is mounted thereon can be reliably prevented and resin molding can be performed with reliability and high precision on the semiconductor element mounted on the film substrate.

A semiconductor device of the present invention is configured to comprise: a film substrate formed of a flexible resin material;

electrodes formed on at least one surface of the film substrate and composed of an electrode pattern of a metal film;

a semiconductor element having bump electrodes connected to the electrodes;

an insulating protection part which is formed on the surface of the semiconductor element opposed to the electrodes and prevents a direct contact of the semiconductor element with the electrode; and a sealing part which is at least formed in the space between the semiconductor element and the film substrate and seals the electrodes and the bump electrodes. Since the present invention configured as mentioned above can reliably prevent the direct contact of the electrodes formed on the film substrate with the edge parts of the semiconductor element at the time the semiconductor element is mounted thereon and can perform the resin molding with reliability and high precision on the semiconductor element mounted on the film substrate, it can provide a high-reliability semiconductor device.

A semiconductor device in accordance with another aspect of the present invention is configured to comprise: a film substrate formed of a flexible resin material;

electrodes formed on at least one surface of the film substrate and composed of an electrode pattern of a metal film;

a semiconductor element having bump electrodes connected to the electrodes, wherein corners on the outer edge parts of the surface opposed to the electrodes are formed of obtuse angles; and a sealing part which is formed between the semiconductor element and the film substrate and seals the electrodes and the bump electrodes. Since the semiconductor device of the present invention configured as mentioned above can reliably prevent the direct contact of the electrodes formed on the film substrate with the edge parts of the semiconductor element at the time the semiconductor element is mounted thereon and can perform the resin molding with reliability and high precision on the semiconductor element mounted on the film substrate, it follows that the semiconductor device is a high-reliability device.

Furthermore, in the semiconductor device of the present invention, by providing a sheet cover formed of a flexible material having an electromagnetic shield effect on the semiconductor element in a state where it sticks fast thereto, a high-reliability semiconductor device can be easily manufactured.

A method for manufacturing a semiconductor device of the present invention comprises: a step of coating a surface of a semiconductor element which has bump electrodes with a resist;

a step of forming an insulating protection part by masking a desired area of the semiconductor element, performing ultraviolet irradiation, and sequentially caring out developing, cleaning and curing processes;

a step of placing the semiconductor element at a desired position on a film substrate having electrodes and connecting the bump electrodes with the electrodes by the application of pressure and heat; and a step of forming a sealing part by injecting a resin between the semiconductor element and the film substrate. The manufacturing method of the present invention having the steps as mentioned above makes it possible to reliably prevent the direct contact of the electrodes formed on the film substrate with the edge parts of the semiconductor element at the time the semiconductor element is mounted thereon and perform the resin molding with reliability and high precision on the semiconductor element mounted on the film substrate.

A method for manufacturing a semiconductor device in accordance with another aspect of the present invention comprises: a step of applying a resin at a desired position on a surface of a semiconductor element which has bump electrodes;

a step of forming an insulating protection part by heat-processing the resin applied to the desired position of the semiconductor element;

a step of placing the semiconductor element at a desired position on a film substrate having electrodes and connecting the bump electrodes with the electrodes by the application of pressure and heat; and a step of forming a sealing part by injecting a resin between the semiconductor element and the film substrate. The manufacturing method of the present invention having the steps as mentioned above makes it possible to reliably prevent the direct contact of the electrodes formed on the film substrate with the edge parts of the semiconductor element at the time the semiconductor element is mounted thereon and perform the resin molding with reliability and high precision on the semiconductor element mounted on the film substrate.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF DRAWINGS

FIG. 6 is a view illustrating a method for manufacturing the semiconductor element in the semiconductor device in accordance with Embodiment 2;

FIG. 8 is a view illustrating a method for manufacturing the semiconductor element in the semiconductor device in accordance with Embodiment 3;

FIG. 10 is a view illustrating a method for manufacturing the semiconductor element in the semiconductor device in accordance with Embodiment 4;

FIG. 14 is a view showing a cross-sectional shape of a corner part of a semiconductor element in accordance with Embodiment 6;

FIG. 17 is a perspective view showing a semiconductor device in accordance with Embodiment 7 of the present invention;

It will be recognized that some or all of the Figures are schematic representations for purposes of illustration and do not necessarily depict the actual relative sizes or locations of the elements shown.

DETAILED DESCRIPTION OF DRAWINGS

Preferred embodiments of a semiconductor device and a manufacturing method thereof in accordance with the present invention will be described below referring to the accompanying drawings.

Embodiment 1

Figure 1:
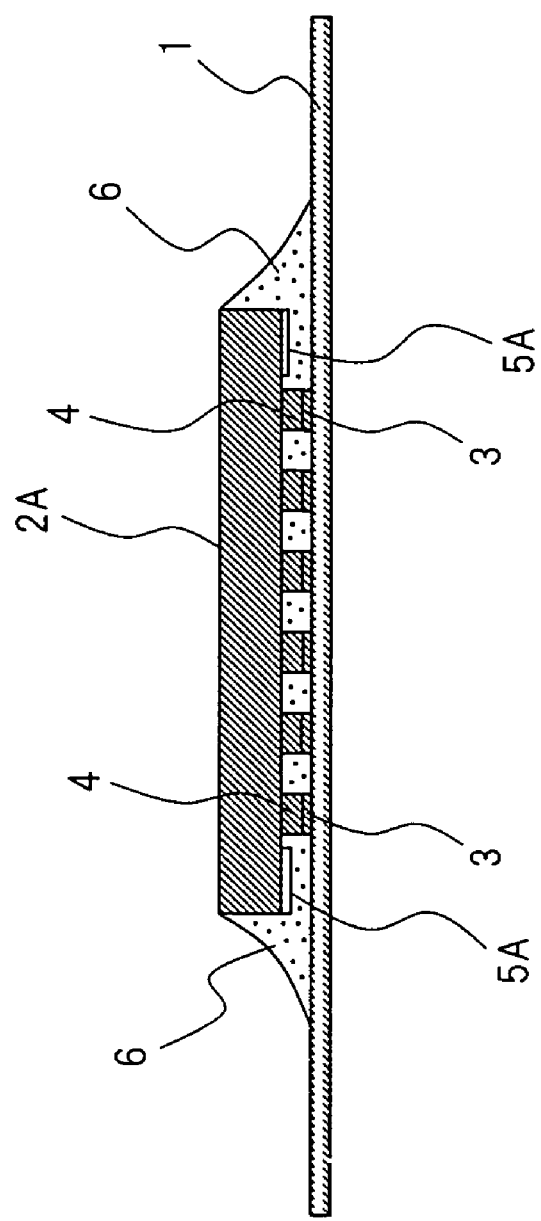
FIG. 1 is a cross-sectional view showing a configuration of a semiconductor device in accordance with Embodiment 1 of the present invention.

FIG. 1 is a cross-sectional view showing a configuration of a semiconductor device in accordance with Embodiment 1 of the present invention.

In Embodiment 1, a film substrate 1 is a substrate formed of a film-shaped flexible resin material, which has electrodes 3 on its surface. A semiconductor element 2A is a semiconductor chip cut from a semiconductor wafer. The electrodes 3 are an electrode pattern of a metal film formed on the film substrate 1 and are made by pattern etching. Bump electrodes 4 formed on the back surface of the semiconductor element 2A are the ones manufactured by plating method before the semiconductor chip is cut from the semiconductor wafer, and are gold (Au) in a projecting shape. Each terminal of the semiconductor element 2A is welded and connected to the gold (Au)-plated electrode of the film substrate 1. Incidentally, the bump electrodes 4 can also be formed of a gold (Au) stud bump so as to have a desired thickness.

As shown in FIG. 1, in the semiconductor device in accordance with Embodiment 1, the bump electrodes 4 of the semiconductor element 2A are connected to the electrodes 3 formed on the film substrate 1. A sealing part 6, which is an epoxy resin, is molded between the semiconductor element 2A and the film substrate 1, so that the junctions of the electrodes 3 on the film substrate 1 and the bump electrodes 4 of the semiconductor element 2A are reliably sealed.

In the semiconductor element 2A in accordance with Embodiment 1, an insulating protection part 5A composed of an insulating resin is formed on the edge parts of the back surface on which the bump electrodes 4 are formed. This insulating protection part 5A serves to prevent the edge parts of the semiconductor element 2A from directly contacting the electrode portions at the time the semiconductor element 2A is mounted on the film substrate 1 and at the molding step.

Incidentally, as the film substrate 1, a flexible sheet which is formed of a polyimide film and has a thickness in the range of 0.01 to 0.2 mm is used for example. Besides such a sheet, any film substrate used as a common substrate can be used. A phenol or acrylic resin may also be used as a resin which forms the sealing part 6. Any other resin having electrical insulation can also be used.

Figure 2:
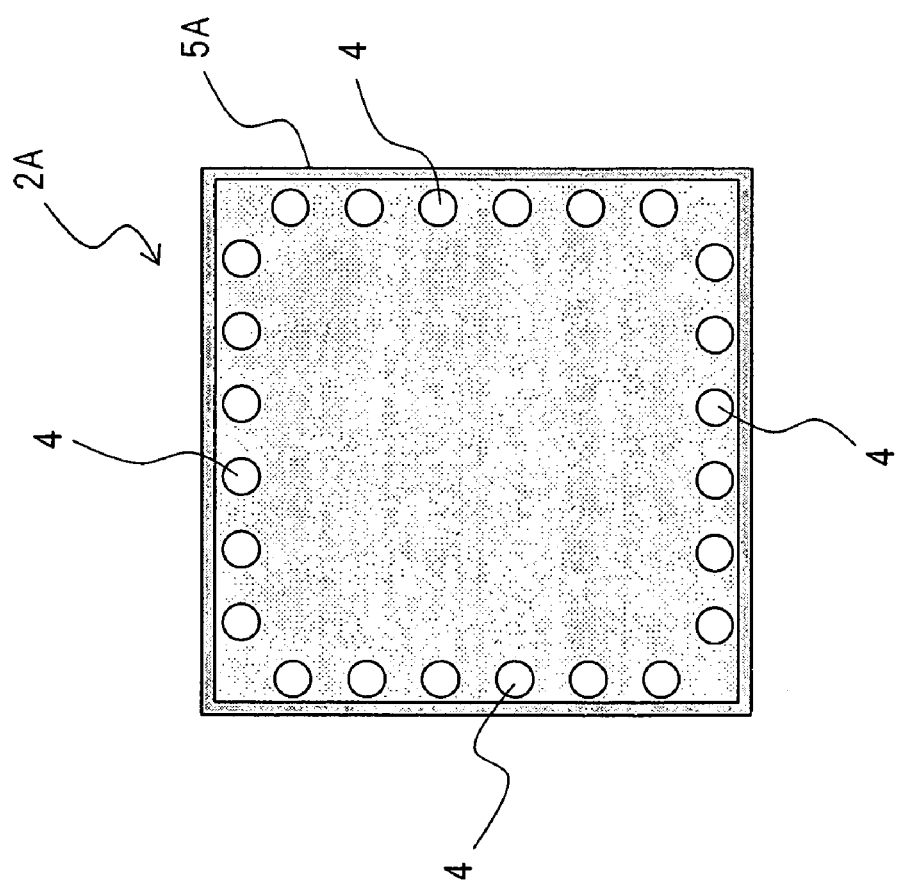
FIG. 2 is a rear view showing a surface of a semiconductor element in accordance with Embodiment 1, on which bump electrodes are formed.

FIG. 2 is a rear view showing the surface of the semiconductor element 2A in accordance with Embodiment 1, on which the bump electrodes 4 are formed. As shown in FIG. 2, in the semiconductor element 2A in accordance with Embodiment 1, the insulating protection part 5A is formed on the outer edge parts of the surface on which a plurality of bump electrodes 4 are formed.

Next, a method for manufacturing the insulating protection part 5A in the semiconductor element 2A shown in FIG. 2 will be described.

Figure 3:
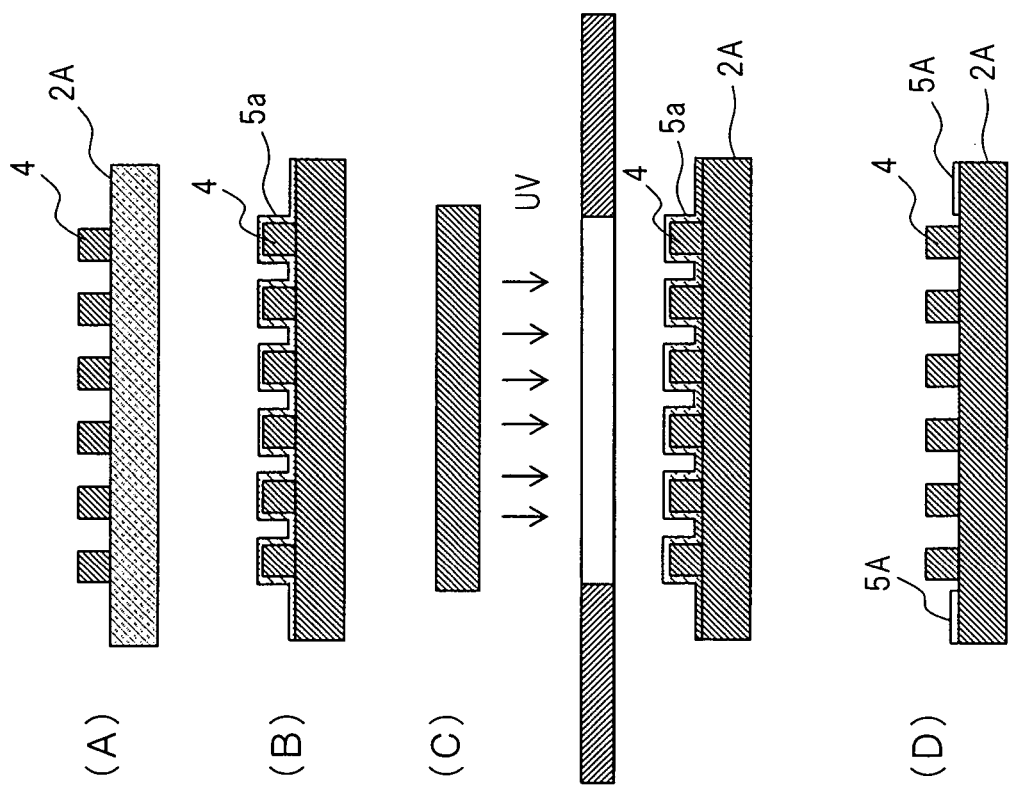
FIG. 3 is a view illustrating a method for manufacturing the semiconductor element in the semiconductor device in accordance with Embodiment 1.
Figure 4:
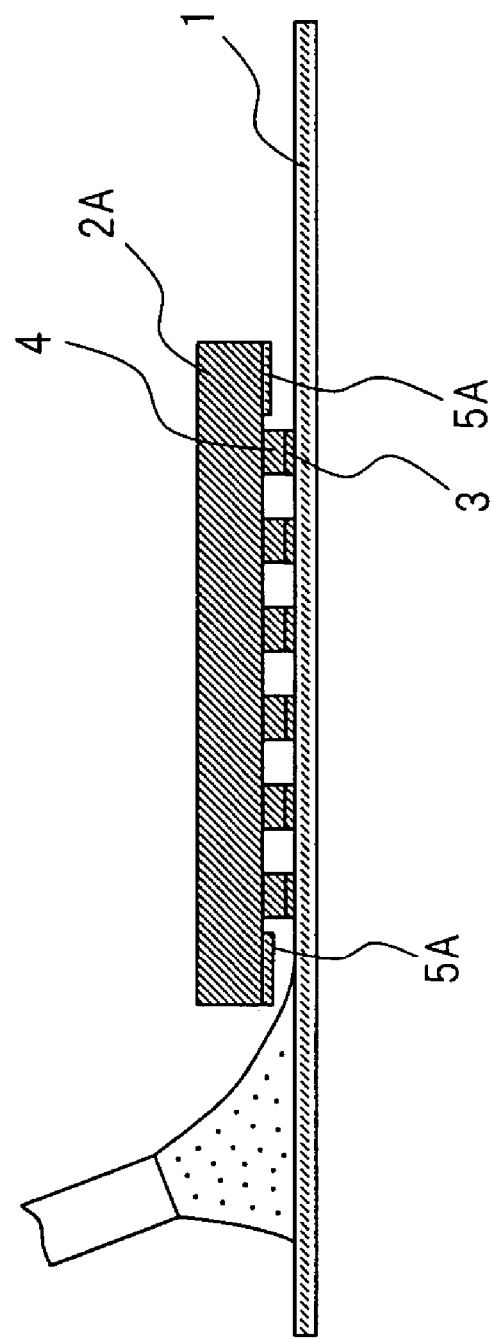
FIG. 4 is a view showing a molding step in the process of manufacturing the semiconductor device in accordance with Embodiment 1.

FIG. 3 is a view illustrating a method for manufacturing the semiconductor element 2A in the semiconductor device in accordance with Embodiment 1. FIG. 4 is a view showing a molding step in the process of manufacturing the semiconductor device in accordance with Embodiment 1.

Part (A) of FIG. 3 shows a state in which the plurality of bump electrodes 4 are formed on the semiconductor element 2A which is a semiconductor chip.

Part (B) of FIG. 3 shows a state in which the semiconductor element 2A in part (A) of FIG. 3 is coated with a positive-type resist 5a by spin coating. In Embodiment 1, an acrylic UV curable resin is used as the positive-type resist 5a. Incidentally, as a method for coating the semiconductor element 2A with the resist 5a, not only the spin coating but also a coating method such as a spray method in common use can be used.

Next, as shown in part (C) of FIG. 3, with the edge parts of the semiconductor element 2A masked, ultraviolet irradiation is performed, and developing, cleaning and curing processes are carried out. Consequently, as shown in part (D) of FIG. 3, in the semiconductor element 2A, the resist 5a on the part which the bump electrodes 4 are formed are removed, and the insulating protection part 5A formed of the insulating resin is manufactured only on the edge parts of the surface (back surface) on which the bump electrodes 4 are formed. This insulating protection part 5A is formed so as to have a thickness in the range of 1 to 5 μm. The semiconductor element 2A configured as mentioned above is placed at a desired position on the film substrate 1. Then, the bump electrodes 4 of the semiconductor element 2A are positioned on the electrodes 3, and by the application of pressure and heat, the bump electrodes 4 are melted and thereby connected to the electrodes 3.

In Embodiment 1, the gap between the surface of the insulating protection part 5A on the back surface of the semiconductor element 2A and the surface of the film substrate 1 is at least 10 μm, preferably, a value in the range of 10 to 15 μm. Since the semiconductor device has a desired gap between the semiconductor element 2A and the film substrate 1 as mentioned above, the resin can be smoothly injected between the semiconductor element 2A and the film substrate 1, and the high-reliability sealing part 6 can thereby be formed without fail at the molding step shown in FIG. 4. Furthermore, at this molding step, even when the edge part (corner) of the semiconductor element 2A contacts the electrode 3 on the film substrate 1, the electrode 3 does not get scratched because the edge part is covered with the insulating protection part 5A.

Incidentally, in Embodiment 1, the description has been made with the example in which the semiconductor element 2A is mounted only on one surface of the film substrate 1, but the configuration in accordance with Embodiment 1 can also be applied in the case where the semiconductor elements are mounted on both surfaces of the film substrate 1. When the semiconductor elements are mounted on both surfaces of the film substrate 1, the structure of the stage for holding the semiconductor device when it is manufactured has to be changed. In this case, a dug part needs to be formed at the part of the stage facing the semiconductor element on the film substrate.

Embodiment 2

A semiconductor device in accordance with Embodiment 2 of the present invention will be described below. The semiconductor device in accordance with Embodiment 2 differs from the above-mentioned semiconductor device in accordance with Embodiment 1 in the shape of an insulating protection part formed on a semiconductor element and the method for manufacturing the same. In the semiconductor device in accordance with Embodiment 2, insulating protection parts which are not in a film shape but in a generally dome shape are formed. In the description of Embodiment 2, the same numerals are assigned to the components having the same functions and the same configurations as in Embodiment 1, and with respect to the detailed descriptions thereof, the descriptions of Embodiment 1 are applied.

In the semiconductor device in accordance with Embodiment 2, as in Embodiment 1, the bump electrodes 4 of a semiconductor element 2B are connected to the electrodes 3 formed on the film substrate 1 (see FIG. 1). The sealing part 6, which is an epoxy resin, is molded between the semiconductor element 2B and the film substrate 1, and the junctions between the electrodes 3 on the film substrate 1 and the bump electrodes 4 of the semiconductor element 2B are reliably sealed.

In the semiconductor element 2B in accordance with Embodiment 2, a plurality of insulating protection parts 5B composed of insulating resins are formed on the back surface on which a plurality of bump electrodes 4 are formed. These insulating protection parts 5B serve to prevent the edge parts of the semiconductor element 2B from directly contacting the electrode portions at the time the semiconductor element 2B is mounted on the film substrate 1 and at the molding step.

Figure 5:
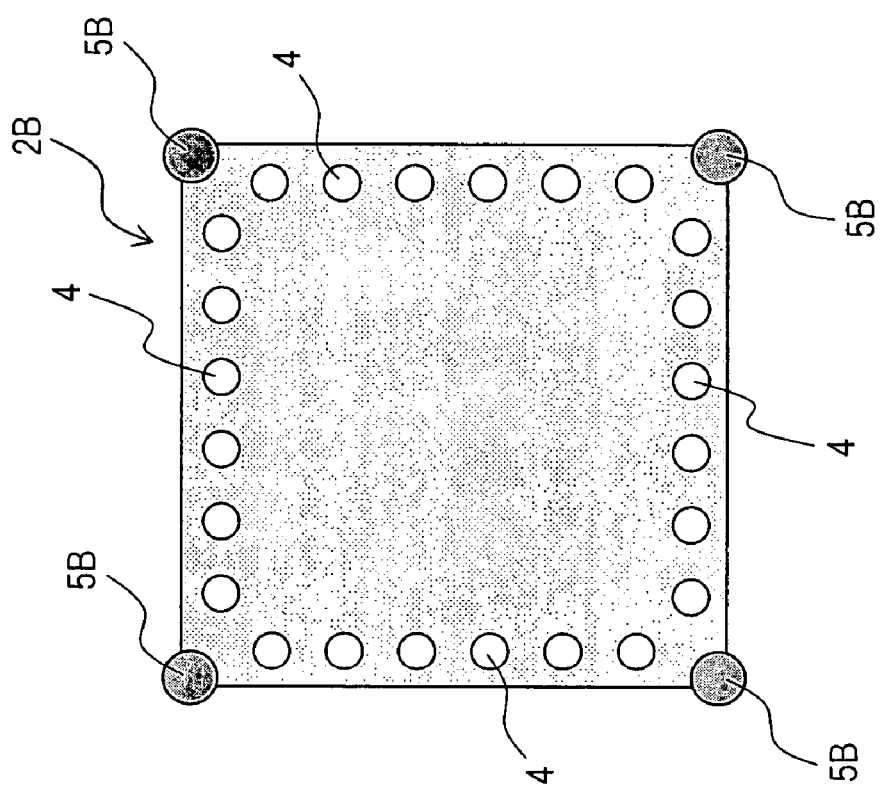
FIG. 5 is a rear view showing a surface of a semiconductor element, on which bump electrodes are formed, in a semiconductor device in accordance with Embodiment 2 of the present invention.

FIG. 5 shows the rectangular back surface of the semiconductor element 2B in accordance with Embodiment 2, on which the bump electrodes 4 are formed. As shown in FIG. 5, in the semiconductor element 2B in accordance with Embodiment 2, the insulating protection parts 5B are formed on the four corners of the back surface on which the plurality of bump electrodes 4 are formed.

Next, the method for manufacturing the insulating protection parts 5B in the semiconductor element 2B shown in FIG. 5 will be described. FIG. 6 is a view illustrating a method for manufacturing the semiconductor element 2B in the semiconductor device in accordance with Embodiment 2.

Part (A) of FIG. 6 shows a state in which the plurality of bump electrodes 4 are formed on the semiconductor element 2B which is a semiconductor chip.

Part (B) of FIG. 6 shows a step of applying epoxy insulating resins to the semiconductor element 2B in part (A) of FIG. 6 by means of a dispenser 10. Incidentally, the insulating resin may be a rubber type resin. For example, it is an elastic material such as a styrene rubber type resin. At the step of applying the epoxy insulating resins by means of the dispenser 10, the semiconductor element 2B is set on the stage. In this stage, a suction cavity for holding the semiconductor element 2B is provided, and the semiconductor element 2B is sucked and is thereby held on the stage. The insulating resins are applied to desired positions on the back surface of the held semiconductor element 2B by means of the dispenser 10. In order that the situation where the applied resin streams down the side of the semiconductor element 2B to thereby soil the stage may not occur at this time, it is recommendable to use the stage with the surface to place the semiconductor element 2B on, the surface being equal to or smaller than the semiconductor element 2B in size.

Next, at the resin-curing step shown in part (C) of FIG. 6, the semiconductor element 2B is placed on the stage being heated, and heated, for example, at a temperature of 150 to 200° C. for 5 minutes. These generally dome-shaped insulating protection parts 5B are formed on the edge parts of the semiconductor element 2B heat-treated as mentioned above. The insulating protection parts 5B are formed so as to have a thickness in the range of 5 to 30 μm. The semiconductor element 2B configured as mentioned above is placed at a desired position on the film substrate 1. The bump electrodes 4 of the semiconductor element 2B are positioned on the electrodes 3, and by the application of pressure and heat, the bump electrodes 4 are melted and thereby connected to the electrodes 3. At the step of connecting these electrodes 3 to the bump electrodes 4, the edge parts (corners) of the semiconductor element 2B do not directly contact the electrodes 3 on the film substrate 1, and the electrodes 3 are thereby prevented from getting scratched or broken.

In Embodiment 2, since the insulating protection parts 5B are formed only on the four corners of the back surface of the semiconductor element 2B, the resin can be easily injected between the semiconductor element 2B and the film substrate 1 at the molding step. Consequently, the sealing part 6 including no cavity or air bubble can be reliably formed in the space between the semiconductor element 2B and the film substrate 1. Furthermore, the edge parts of the semiconductor element 2B are prevented from contacting the electrodes 3 on the film substrate 1 at this molding step. Since the insulating protection parts 5B in accordance with Embodiment 2 are formed of the resins which are elastic-deformed, the distance from the surface of the semiconductor element 2B on which the bump electrodes 4 are formed to the surface of the film substrate 1 can be easily set to a desired value, for example, at least 10 μm, preferably, a desired value in the range of 10 to 15 μm. Since the semiconductor element 2B in accordance with Embodiment 2 has a desired gap between the film substrate 1 and itself and the insulating protection parts 5B are not formed at such positions that the insulating protection parts 5B get in the way of the injection of the resin as mentioned above, the resin can be easily and reliably injected between the semiconductor element 2B and the film substrate 1 at the molding step.

Embodiment 3

A semiconductor device in accordance with Embodiment 3 of the present invention will be described below. The semiconductor device in accordance with Embodiment 3 differs from the above-mentioned semiconductor device in accordance with Embodiment 1 in the shape of an insulating protection part formed on a semiconductor element and the method for manufacturing the same. In the description of Embodiment 3, the same numerals are assigned to components having the same functions and the same configurations as in Embodiment 1, and with respect to the detailed descriptions thereof, the descriptions of Embodiment 1 are applied.

In the semiconductor device in accordance with Embodiment 3, as in Embodiment 1, the bump electrodes 4 of a semiconductor element 2C are connected to the electrodes 3 formed on the film substrate 1. The sealing part 6, which is an epoxy resin, is molded between the semiconductor element 2C and the film substrate 1, and the junctions between the electrodes 3 on the film substrate 1 and the bump electrodes 4 of the semiconductor element 2C are thereby reliably sealed.

In the semiconductor element 2C in accordance with Embodiment 3, on the back surface on which a plurality of bump electrodes 4 are formed, a plurality of insulating protection parts 5C composed of insulating resins are formed. These insulating protection parts 5C serve to prevent the edge parts of the semiconductor element 2C from directly contacting the electrode portions at the time the semiconductor element 2C is mounted on the film substrate 1 and at the molding step.

Figure 7:
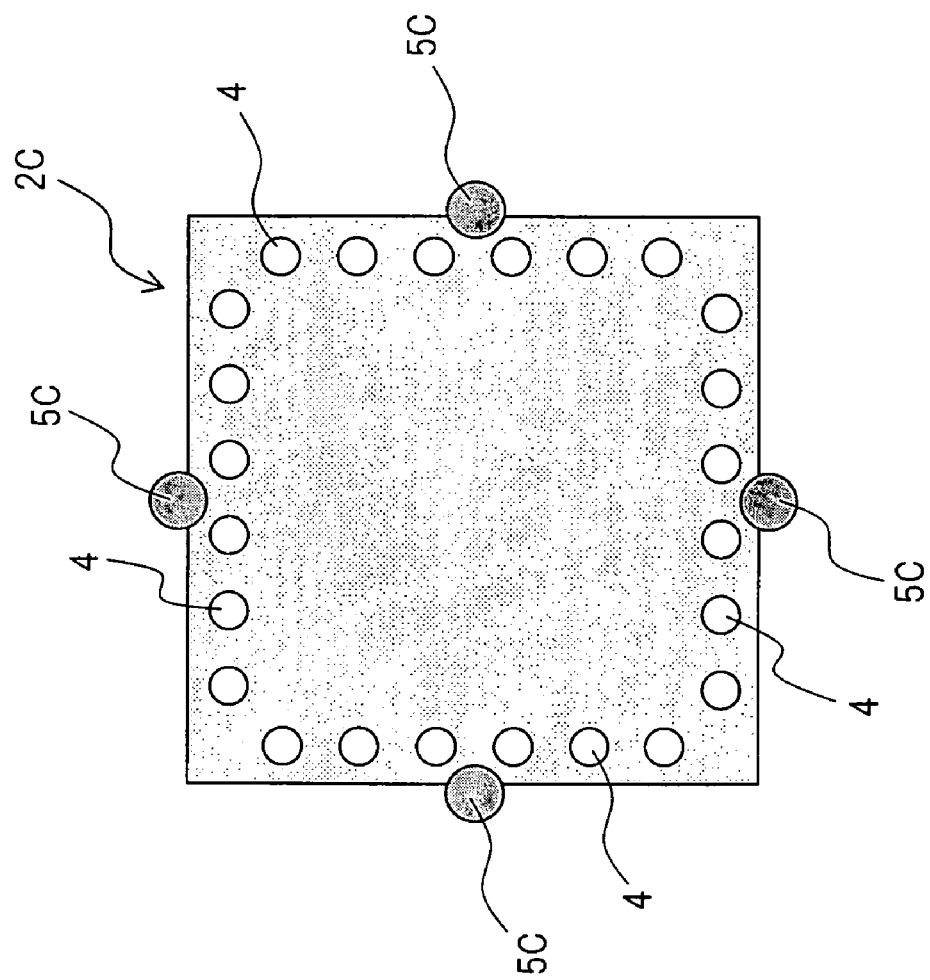
FIG. 7 is a rear view showing a surface of a semiconductor element, on which bump electrodes are formed, in a semiconductor device in accordance with Embodiment 3 of the present invention.

FIG. 7 shows the rectangular back surface of the semiconductor element 2C in accordance with Embodiment 3, on which the bump electrodes 4 are formed. As shown in FIG. 7, in the semiconductor element 2C in accordance with Embodiment 3, four insulating protection parts 5C are formed on the edge parts (corners) of the back surface on which the plurality of bump electrodes 4 are formed.

Next, the method for manufacturing the insulating protection parts 5C in the semiconductor element 2C shown in FIG. 7 will be described. FIG. 8 is a view illustrating a method for manufacturing the semiconductor element 2C in the semiconductor device in accordance with Embodiment 3.

Part (A) of FIG. 8 shows a state in which the plurality of bump electrodes 4 are formed on the semiconductor element 2C which is a semiconductor chip.

Part (B) of FIG. 8 shows a step of applying epoxy insulating resins to the edge parts of the semiconductor element 2C in part (A) of FIG. 8 by means of the dispenser 10. Incidentally, the insulating resin may also be a rubber type resin, for example, a styrene resin.

Next, at the resin curing step shown in part (C) of FIG. 8, the semiconductor element 2C is placed on the stage being heated, and heated, for example, at a temperature of 150 to 200° C. for five minutes. A generally dome-shaped insulating protection parts 5C are formed at four positions on the edge parts on the back surface of the semiconductor element 2C heat-processed as mentioned above. These insulating protection parts 5C have a thickness in the range of 5 to 30 µm, and are formed, one at the generally midpoint position of each side of the rectangular back surface. The semiconductor element 2C formed as mentioned above is placed at a desired position on the film substrate 1. Then, the bump electrodes 4 of the semiconductor element 2C are positioned on the electrodes 3, and by the application of pressure and heat, the bump electrodes 4 are melted and thereby connected to the electrodes 3. At this step of connecting the electrodes 3 with the bump electrodes 4, the edge parts (corners) of the semiconductor element 2C do not directly contact the electrodes 3 on the film substrate 1, and the electrodes 3 are thereby prevented from getting scratched or broken. Incidentally, in Embodiment 3, the description has been made with the example where the insulating protection parts 5C are each provided at only one position on each side of the back surface of the semiconductor element 2C, but they may be provided at a plurality of positions thereon according to the shape of the semiconductor element.

In Embodiment 3, the insulating protection parts 5C are formed at only a bare minimum number of positions on the back surface of the semiconductor element 2C, so that the resin can be easily injected between the semiconductor element 2C and the film substrate 1 at the molding step. Consequently, the sealing part 6 including no cavity or air bubble can be reliably formed in the space between the semiconductor element 2C and the film substrate 1. Furthermore, the edge parts of the semiconductor element 2C are also prevented from contacting the electrodes 3 on the film substrate 1 at the molding step. The insulating protection parts 5C in accordance with Embodiment 3 are formed of the resins which are elastic-deformed, the distance from the surface of the semiconductor element 2C on which the bump electrodes 4 are formed to the surface of the film substrate 1 can be easily set to a desired distance, for example, at least 10 µm, preferably, a desired value in the range of 10 to 15 µm. As described above, the semiconductor element 2C in accordance with Embodiment 3 has a desired gap between the film substrate 1 and itself, and the insulating protection parts 5C are not formed at such positions that they get in the way of the injection of the resin, so that the resin can be easily and reliably injected between the semiconductor element 2C and the film substrate 1 at the molding step.

Embodiment 4

A semiconductor device in accordance with Embodiment 4 of the present invention will be described below. The semiconductor device in accordance with Embodiment 4 differs from the above-mentioned semiconductor device in accordance with Embodiment 1 in the shape of an insulating protection part formed on a semiconductor element and the method for manufacturing the same. In the description of Embodiment 4, the same numerals are assigned to components having the same functions and the same configurations as in Embodiment 1, and with respect to the detailed descriptions thereof, the descriptions of Embodiment 1 are applied.

In the semiconductor device in accordance with Embodiment 4, as in Embodiment 1, the bump electrodes 4 of a semiconductor element 2D are connected to the electrodes 3 formed on the film substrate 1. The sealing part 6, which is an epoxy resin, is molded between the semiconductor element 2D and the film substrate 1, and the junctions between the electrodes 3 on the film substrate 1 and the bump electrodes 4 of the semiconductor element 2D are thereby reliably sealed.

In the semiconductor element 2D in accordance with Embodiment 4, on the back surface on which a plurality of bump electrodes 4 are formed, an insulating protection part 5D composed of an insulating resin is formed. This insulating protection part 5D serves to prevent the edge parts of the semiconductor element 2D from directly contacting the electrode portions at the time the semiconductor element 2D is mounted on the film substrate 1 and at the molding step.

Figure 9:
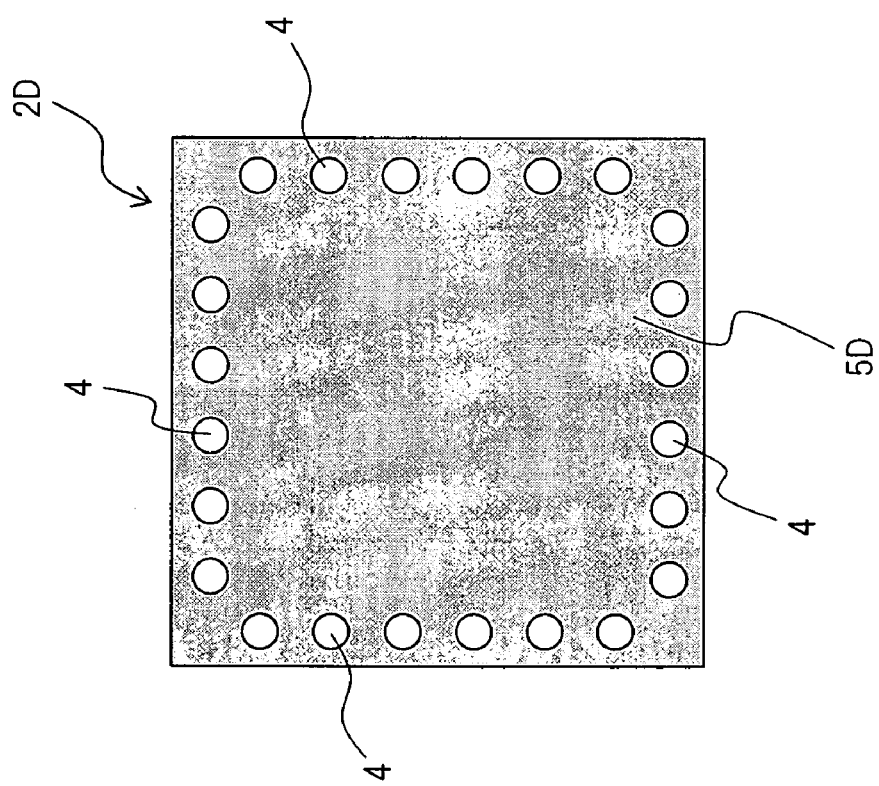
FIG. 9 is a rear view showing a surface of a semiconductor element, on which bump electrodes are formed, in a semiconductor device in accordance with Embodiment 4 of the present invention.

FIG. 9 shows the back surface of the semiconductor element 2D in accordance with Embodiment 3, on which the bump electrodes 4 are formed. As shown in FIG. 9, in the semiconductor element 2D in accordance with Embodiment 4, the film-shaped insulating protection part 5D is formed on the surface on which the plurality of bump electrodes 4 are formed. The insulating protection part 5D in accordance with Embodiment 4 is formed so as to cover the area except the bump electrodes 4 of the back surface of the semiconductor element 2D.

Next, the method for manufacturing the insulating protection part 5D in the semiconductor element 2D shown in FIG. 9 will be described. FIG. 10 is a view illustrating a method for manufacturing the semiconductor element 2D in the semiconductor device in accordance with Embodiment 4.

Part (A) of FIG. 10 shows a state in which the plurality of bump electrodes 4 are formed on the semiconductor element 2D which is a semiconductor chip.

Part (B) of FIG. 10 shows a state in which the semiconductor element 2D in part (A) of FIG. 10 is coated with a positive-type resist 5*d* by spin coating. In Embodiment 4, as the positive-type resist 5*d*, an acrylic UV curable resin is used. As the material of the resist 5*d* used here, a material with high wettability to the epoxy resin which is the material of the sealing part 6 is selected. By selecting the material with high wettability to the epoxy resin as mentioned above, the sealing performance of the resin of the sealing part 6 is improved. Incidentally, as the method for coating the semiconductor element 2D with the resist 5d, not only the spin coating but also a coating method in common use can be used.

Next, as shown in part (C) of FIG. 10, the parts of the semiconductor element 2D, where the bump electrodes are not formed, are masked, ultraviolet irradiation is performed, and developing, cleaning and curing processes are carried out. Consequently, as shown in part (D) of FIG. 10, on the back surface of the semiconductor element 2D, the resist 5d on the parts on which the bump electrodes 4 are formed is removed, and the insulating protection part 5D formed of the insulating resin is formed on the rest of the surface. This insulating protection part 5D is formed so as to have a thickness in the range of 1 to 5 μm. The semiconductor element 2D formed as mentioned above is placed at a desired position on the film substrate 1. Then, the bump electrodes 4 of the semiconductor element 2D are positioned on the electrodes 3, and by the application of pressure and heat, the bump electrodes 4 are melted and thereby connected to the electrodes 3. At this step of connecting the electrodes 3 with the bump electrodes 4, the edge parts (corners) of the semiconductor element 2D do not directly contact the electrodes 3 on the film substrate 1, and the electrodes 3 are thereby prevented from getting scratched or broken.

In Embodiment 4, the distance from the surface of the insulating protection part 5D on the back surface of the semiconductor element 2D to the surface of the film substrate 1 is at least 10 μm, preferably a gap in the range of 10 to 15 μm. Since the semiconductor device has a desired gap between the semiconductor element 2D and the film substrate 1, the resin can be easily injected between the semiconductor element 2D and the film substrate 1 at the molding step. Consequently, the sealing part 6 including no cavity or air bubble can be reliably formed in the space between the semiconductor element 2D and the film substrate 1. Furthermore, at this molding step, even when the edge part of the semiconductor element 2D contacts the electrode 3 on the film substrate 1, the electrode 3 is prevented from getting scratched because the edge part is covered with the insulating protection part 5D.

Embodiment 5

A semiconductor device in accordance with Embodiment 5 of the present invention will be described below. The semiconductor device in accordance with Embodiment 5 differs from the above mentioned semiconductor device in accordance with Embodiment 1 in the shape of an insulating protection part formed on a semiconductor element and the method for manufacturing the same. In the description of Embodiment 5, the same numerals are assigned to components having the same functions and the same configurations as in Embodiment 1, and with respect to the detailed descriptions thereof, the descriptions of Embodiment 1 are applied.

In the semiconductor device in accordance with Embodiment 5, as in Embodiment 1, the bump electrodes 4 of a semiconductor element 2E are connected to the electrodes 3 formed on the film substrate 1. The sealing part 6, which is an epoxy resin is molded between the semiconductor element 2E and the film substrate 1, and the junctions between the electrodes 3 on the film substrate 1 and the bump electrodes 4 of the semiconductor element 2E are thereby reliably sealed.

In the semiconductor element 2E in accordance with Embodiment 5, on the back surface on which a plurality of bump electrodes 4 are formed, insulating protection parts 5E composed of insulating resins are formed. These insulating protection parts 5E serve to prevent the edge parts of the semiconductor element 2E from directly contacting the electrode portions at the time the semiconductor element 2E is mounted on the film substrate 1 and at the molding step.

Figure 11:
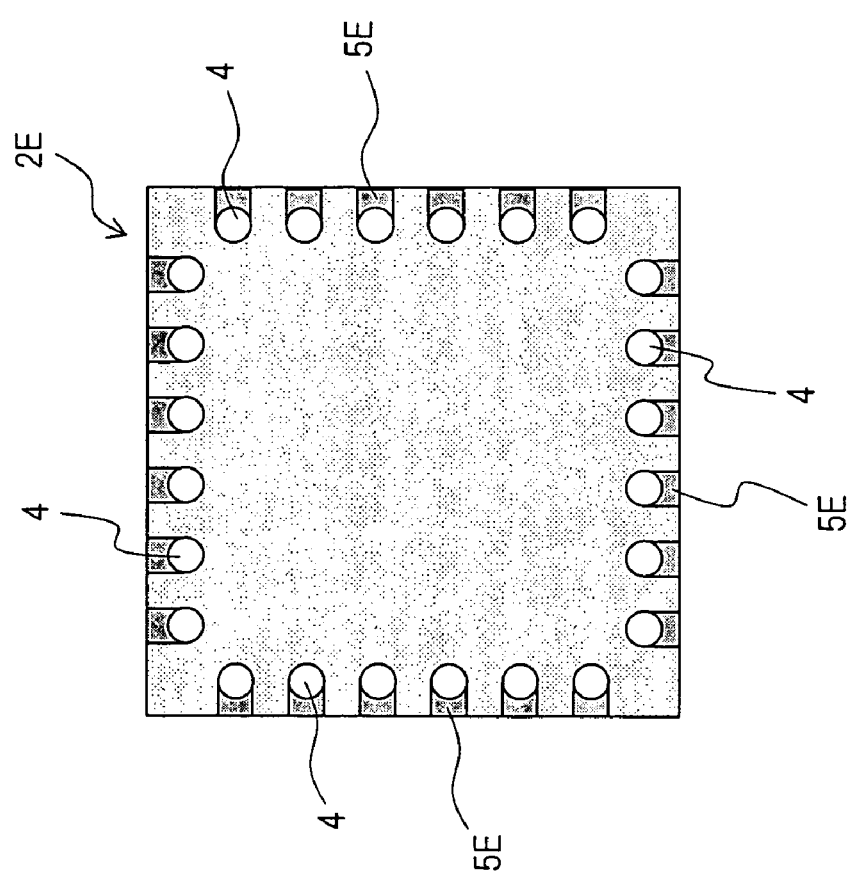
FIG. 11 is a rear view showing a surface of a semiconductor element, on which bump electrodes are formed, in a semiconductor device in accordance with Embodiment 5 of the present invention.

FIG. 11 shows the back surface of the semiconductor element 2E in accordance with Embodiment 5, on which the bump electrodes 4 are formed. As shown in FIG. 11, in the semiconductor element 2E in accordance with Embodiment 5, the film-shaped insulating protection parts 5E are formed on the surface on which the plurality of bump electrodes 4 are formed. The insulating protection parts 5E in accordance with Embodiment 5 are formed in the areas in the vicinity of the bump electrodes 4 on the back surface of the semiconductor element 2E, which are the areas between the edge parts (corners) and the bump electrodes 4 on the back surface thereof.

Figure 12:
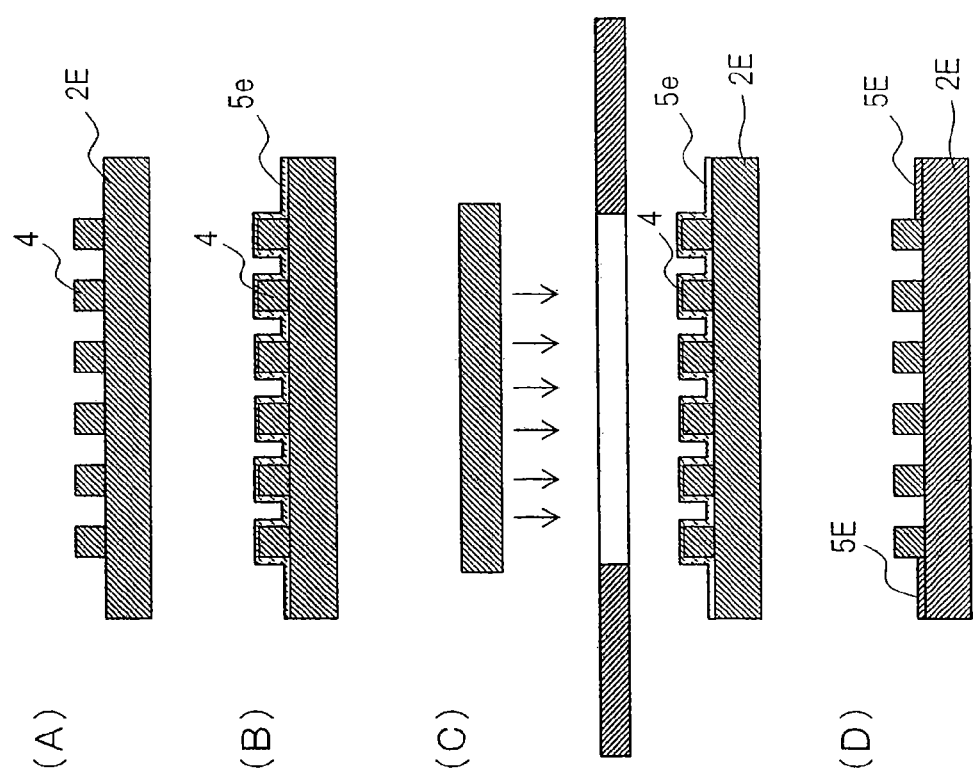
FIG. 12 is a view illustrating a method for manufacturing the semiconductor element in the semiconductor device in accordance with Embodiment 5.

Next, the method for the manufacturing the insulating protection parts 5E in the semiconductor element 2E shown in FIG. 11 will be described. FIG. 12 is a view illustrating a method for manufacturing the semiconductor element 2E in the semiconductor device in accordance with Embodiment 5.

Part (A) of FIG. 12 shows a state in which the plurality of bump electrodes 4 are formed on the semiconductor element 2E which is a semiconductor chip.

Part (B) of FIG. 12 shows a state in which the semiconductor element 2E of part (A) of FIG. 12 is coated with a positive-type resist 5e by spin coating. In Embodiment 5, an acrylic UV curable resin is used as the positive-type resist 5e. Incidentally, as the method for coating the semiconductor element 5E with the resist 5e, not only the spin coating but also a coating method in common use can be used.

Next, as shown in part (C) of FIG. 12, the areas outside the bump electrodes 4 on the back surface of the semiconductor element 2E are masked, ultraviolet irradiation is performed, and development, cleaning and curing processes are carried out. Consequently, as shown in FIG. 11 and part (D) of FIG. 12, on the back surface of the semiconductor element 2E, the insulating protection parts 5E made of the insulating resins are formed on the areas outside the bump electrodes 4. These insulating protection parts 5E are formed so as to have a thickness in the range of 1 to 5 μm. The semiconductor element 2E formed as mentioned above is placed at a desired position on the film substrate 1. Then, the bump electrodes 4 of the semiconductor element 2E are positioned on the electrodes 3, and by the application of pressure and heat, the bump electrodes 4 are melted and thereby connected to the electrodes 3. At this step of connecting the electrodes 3 with the bump electrodes 4, the edge parts (corners) of the semiconductor element 2E do not directly contact the electrodes 3 on the film substrate 1, and the electrodes 3 are thereby prevented from getting scratched or broken.

In Embodiment 5, the distance from the surface of the insulating protection parts 5E on the back surface of the semiconductor element 2E to the surface of the film substrate 1 is at least 10 μm, preferably a gap in the range of 10 to 15 μm. Since the semiconductor device has a desired gap between the semiconductor element 2E and the film substrate 1, the resin can also be easily injected between the semiconductor element 2E and the film substrate 1 at the molding step. Consequently, the sealing part 6 including no cavity or air bubble can be reliably formed in the space between the semiconductor element 2E and the film substrate 1. Furthermore, at this molding step, even when the edge part in the vicinity of the bump electrode of the semiconductor element 2E contacts the electrode 3 on the film substrate 1 owing to warpage of the film substrate 1, the electrode 3 does not get scratched because the edge part is covered with the insulating protection part 5E.

Incidentally, in Embodiment 5, the description has been made with the example in which the insulating protection part 5E is formed in close vicinity to each bump electrode 4, but the insulating protection parts 5E do not need to be formed in one-to-one correspondence with all the bump electrodes 4, and the number of the formation positions thereof may be limited to a fewer number according to the shape of the semiconductor element.

Embodiment 6

A semiconductor device in accordance with Embodiment 6 of the present invention will be described below. The semiconductor device in accordance with Embodiment 6 differs from the above-mentioned semiconductor device in accordance with Embodiment 1 in the shape of a semiconductor element and the method for manufacturing the same. In the description of Embodiment 6, the same numerals are assigned to components having the same functions and the same configurations as in Embodiment 1, and with respect to the detailed descriptions thereof, the descriptions of Embodiment 1 are applied.

Figure 13:
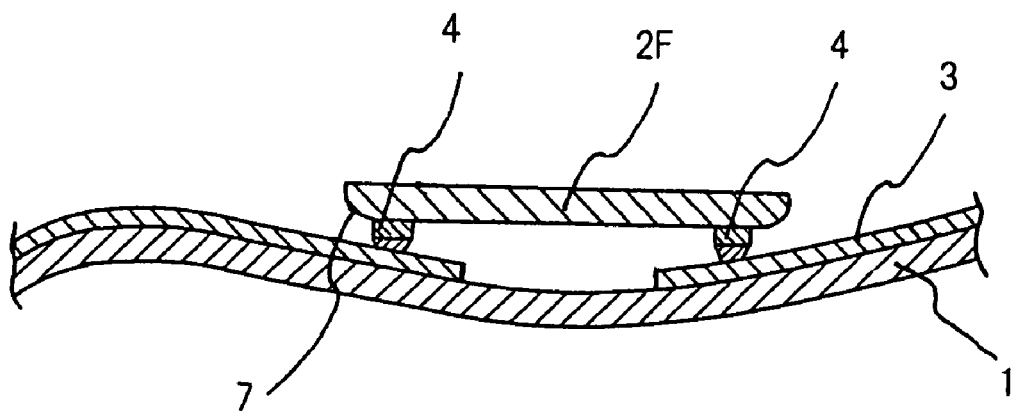
FIG. 13 is a cross-sectional view showing a configuration of a semiconductor device in accordance with Embodiment 6 of the present invention.

FIG. 13 is a cross-sectional view showing a configuration of the semiconductor device in accordance with Embodiment 6 of the present invention. In Embodiments 1 to 5 mentioned above, the configuration is employed wherein the insulating protection parts are formed on the back surface portion of the semiconductor element, and the direct contact of the electrodes 3 with the semiconductor element 2 is thereby eliminated, so that an electrode breakage or the like is prevented. Furthermore, FIG. 13 shows the stage before the sealing part 6 is formed, and represents the state in which the film substrate 1 is bent. In the semiconductor device in accordance with Embodiment 6, as shown in FIG. 13, corner parts 7 are formed to have obtuse angles. These corner parts 7 are formed on the outer edge parts on the surface of a semiconductor element 2F opposed to the film substrate 1, in other words, on the surface on which the bump electrodes 4 are provided. The configuration is employed wherein, by forming the corner parts 7 as mentioned above, the contact of the electrodes 3 with the semiconductor element 2F is inhibited, and even when the electrode 3 contacts the corner 7 of the semiconductor element 2F, the electrode 3 is unlikely to get scratched and broken.

The cross-sectional shape of the corner part 7 of the semiconductor element 2F is a generally curved shape as shown in part (a) of FIG. 14. However, as shown in part (b) of FIG. 14, it may also be at least a shape in which the generally right angle between the back surface and the side surface of the semiconductor element is cut. In other words, it is only essential that the cross-sectional shape of the corner part 7 be at least a shape with obtuse angles, which are greater than 90 degrees.

Next, a method for manufacturing the corner parts 7 of the semiconductor element 2F will be described.

As a method for forming the corner parts 7 of the semiconductor element 2F, a method for forming the same by grinding can be cited, but since the semiconductor element 2F is brittle and splintery in structure, the forming method mentioned below is employed in Embodiment 6.

Figure 15:
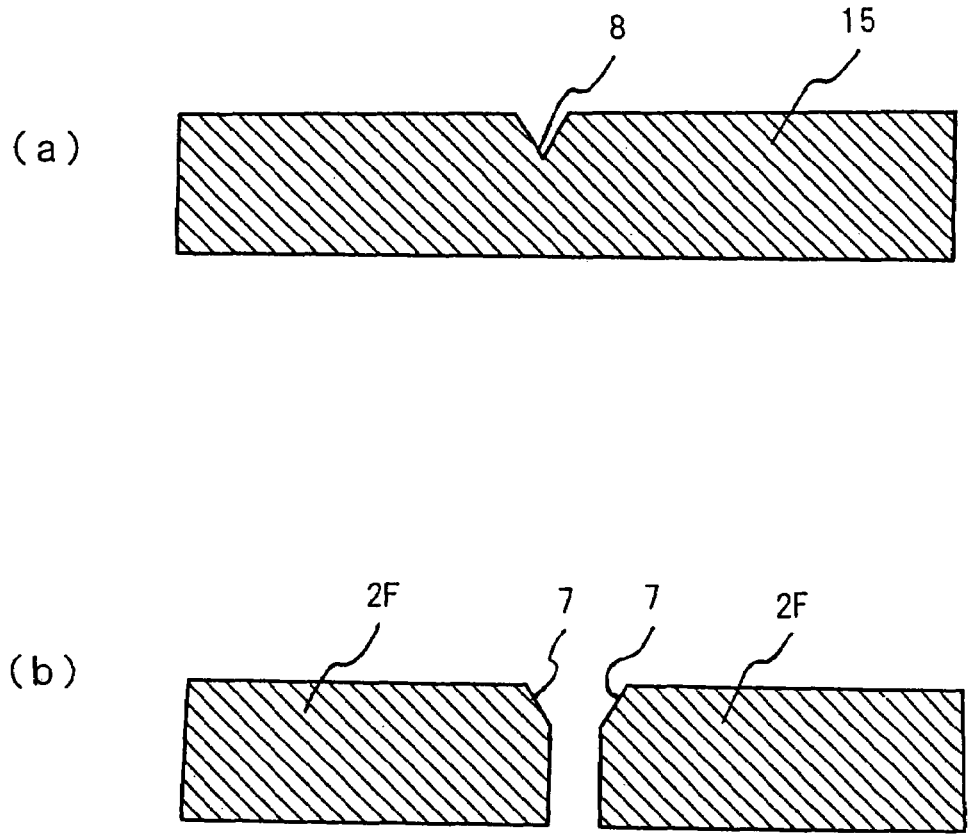
FIG. 15 a view showing a method for forming the corner part in the semiconductor device in accordance with Embodiment 6 of the present invention.

FIG. 15 is a view showing the method for forming the corner parts 7 in the semiconductor device in accordance with Embodiment 6. In the case where a semiconductor wafer 15 is cut, a notch 8 is formed as shown in part (a) of FIG. 15. The method for forming this notch 8 depends on the shape of a diamond blade at a dicing (cutting) step and is performed by carrying out dicing (cutting) along the line indicating the cut position on the semiconductor wafer 15. At this time, the semiconductor wafer 15 is held on the stage which is a level plane, and is cut by a dicing blade placed on the vertical thereof. The shape of the blade edge with a diamond which is used on this occasion is set according to the shape of the notch 8.

Next, as shown in part (b) of FIG. 15, the semiconductor wafer 15 is cut along the notch 8 formed as mentioned above by the use of a blade thinner than the above-mentioned dicing blade. In the semiconductor element 2F, which is a semiconductor chip cut and formed as mentioned above, the corner parts 7 are cut with the oblique plane. Consequently, the corner parts 7 have a cross-sectional shape which does not include any acute angle but has obtuse angles.

Figure 16:
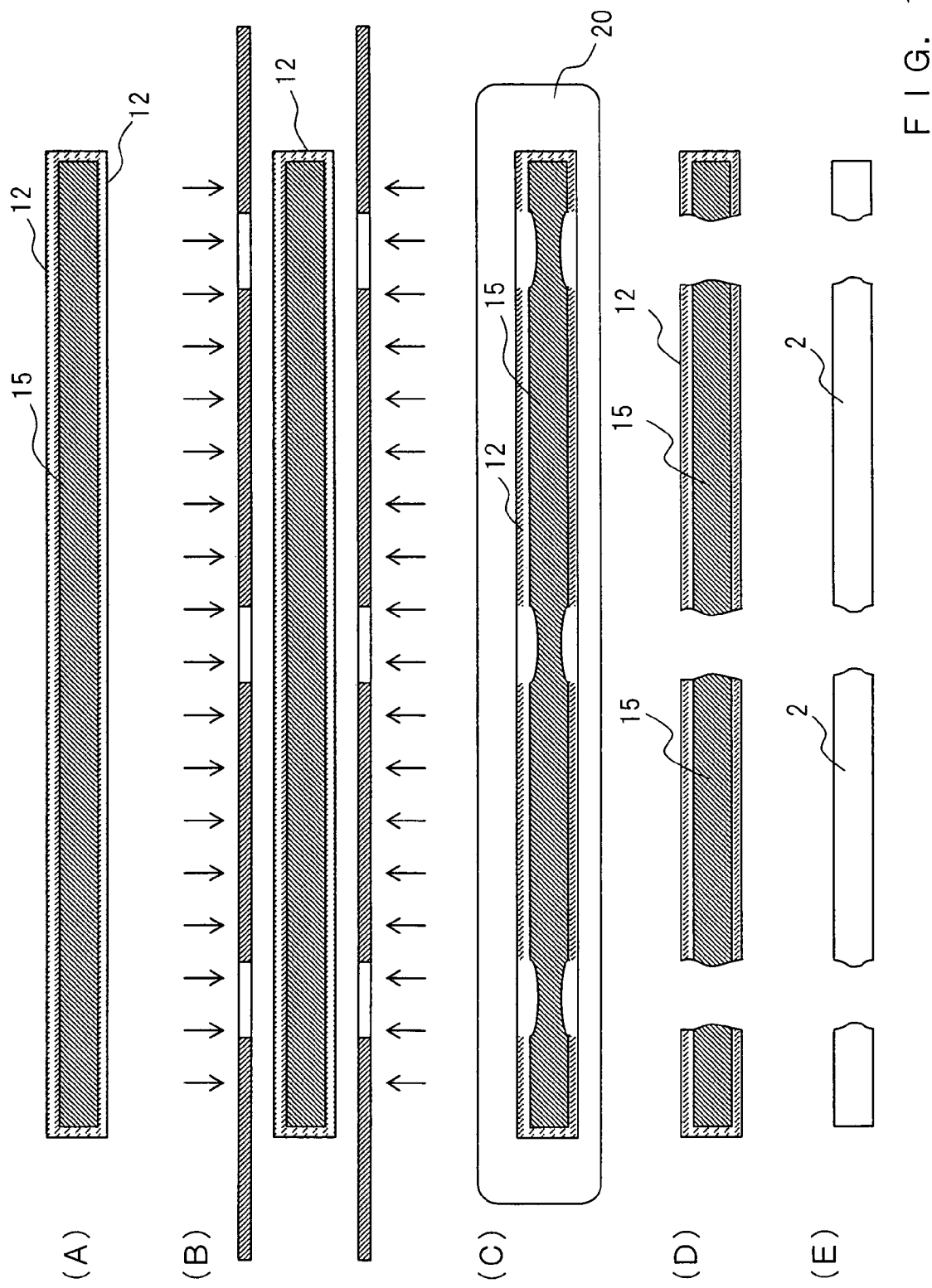
FIG. 16 is a view showing a method for cutting a semiconductor wafer by etching in a manufacturing method in accordance with Embodiment 6.

Next, another method for forming the corner parts 7 in the semiconductor device will be described. In this forming method, the semiconductor element 2F is formed by dicing (cutting) the semiconductor wafer 15 by etching. FIG. 16 is a view showing the method for cutting the semiconductor wafer 15 by etching. In part (A) of FIG. 16, all the surfaces of the semiconductor wafer 15 are coated with a resist 12. As a material of the resist 12 used here, for example, a UV curable resin is preferable. Incidentally, the bump electrodes made by gold plating are formed on the semiconductor wafer 15, which is omitted in FIG. 16. Next, with respect to the semiconductor wafer 15, a resist pattern is placed wherein the parts opposed to the positions at which cutting is carried out open, and an exposure is performed. This process of placing the resist pattern and performing an exposure is carried out on both the surfaces of the semiconductor wafer 15 (part (B) of FIG. 16). At this time, developing, cleaning, and curing processes are sequentially carried out.

Next, as shown in part (C) of FIG. 16, the semiconductor wafer 15 subjected to the exposure process is immersed in a hydrofluoric acid etching solution 20, so that desired positions of the semiconductor wafer 15 are etched. Part (D) of FIG. 16 shows a state of the semiconductor wafer 15 fused and cut by the etching solution 20. As the etching solution 20 at this time, an isotropic etching solution is used. Subsequently, the resist 12 is removed, and the semiconductor wafer 15 goes to the state of being cut at the desired positions (part (E) of FIG. 16). The section of the semiconductor wafer 15 cut as mentioned above has a smooth shape which does not include any part with an acute angle. Incidentally, the description has been made above with the example where the semiconductor wafer 15 subjected to the exposure process is immersed in the etching solution 20, but the semiconductor wafer 15 may be cut by the method in which the semiconductor wafer 15 is showered with the etching solution 20. The bump electrodes are described with the example in which they are made by gold plating, but they may be made by means of a bump bonder device on the semiconductor wafer after the cutting is performed.

As mentioned above, in the semiconductor element 2F in accordance with Embodiment 6, the corner parts 7 are formed of obtuse angles, so that even when the electrode 3 on the film substrate 1 contacts the corner part 7, the electrode 3 is prevented from getting scratched by the semiconductor element 2F.

Furthermore, in Embodiment 6, only the addition of the simple manufacturing step makes it possible to manufacture a high-reliability semiconductor device. The method for manufacturing the semiconductor device in accordance with Embodiment 6 can be applied to a high-density mounting film substrate, and has an effect of keeping down manufacturing costs of high-performance equipment.

Furthermore, since the corner parts 7 are formed in the semiconductor element 2F in accordance with Embodiment 6, the injection of the resin can be easily and reliably performed at the step of forming the sealing part by molding the resin.

Embodiment 7

A semiconductor device in accordance with Embodiment 7 of the present invention will be described below. In the semiconductor device in accordance with Embodiment 7, a cover sheet 20 is provided on the top of a semiconductor element on the film substrate. In Embodiment 7, the semiconductor elements described in Embodiments 1 to 6 mentioned above can be used. In the description of Embodiment 7, the same numerals are assigned to the components having the same functions and the same configurations as in Embodiment 1, and with respect to the detailed descriptions thereof, the descriptions of Embodiment 1 are applied.

Figure 18:
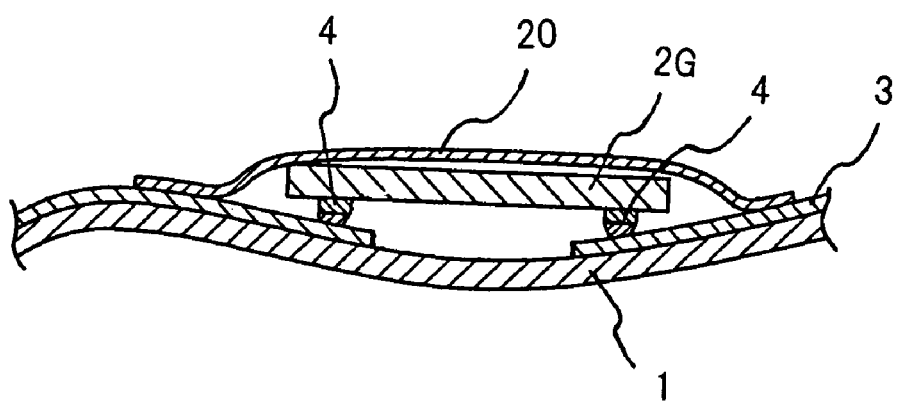
FIG. 18 is a cross-sectional view showing a configuration of the semiconductor device in accordance with Embodiment 7.

FIG. 17 is a perspective view showing the semiconductor device in accordance with Embodiment 7 of the present invention. FIG. 18 is a cross-sectional view showing a configuration of the semiconductor device in accordance with Embodiment 7.

In the semiconductor device in accordance with Embodiment 7, the electrodes 3 are formed on the film substrate 1, and a semiconductor element 2G is connected via the bump electrodes 4 to the top sides of the electrodes 3. In the semiconductor device in accordance with Embodiment 7, the sheet cover 20 is provided on the semiconductor element 2G. This sheet cover 20 is formed of a material having an electromagnetic shield effect and the thickness thereof is set at the value in the range of 0.1 to 1.0 mm. Incidentally, an example of the material having the electromagnetic shied effect is an insulating resin laminated with copper foil.

As shown in FIG. 17, the plane shape of the semiconductor element 2G used in Embodiment 7 is rectangular. The sheet cover 20 is fixed to the film substrate 1 so as to cover both of the shorter sides of the rectangular semiconductor element 2G. On the other hand, the longer sides of the semiconductor element 2G are in the state of being exposed from the sheet cover 20.

Figure 19:
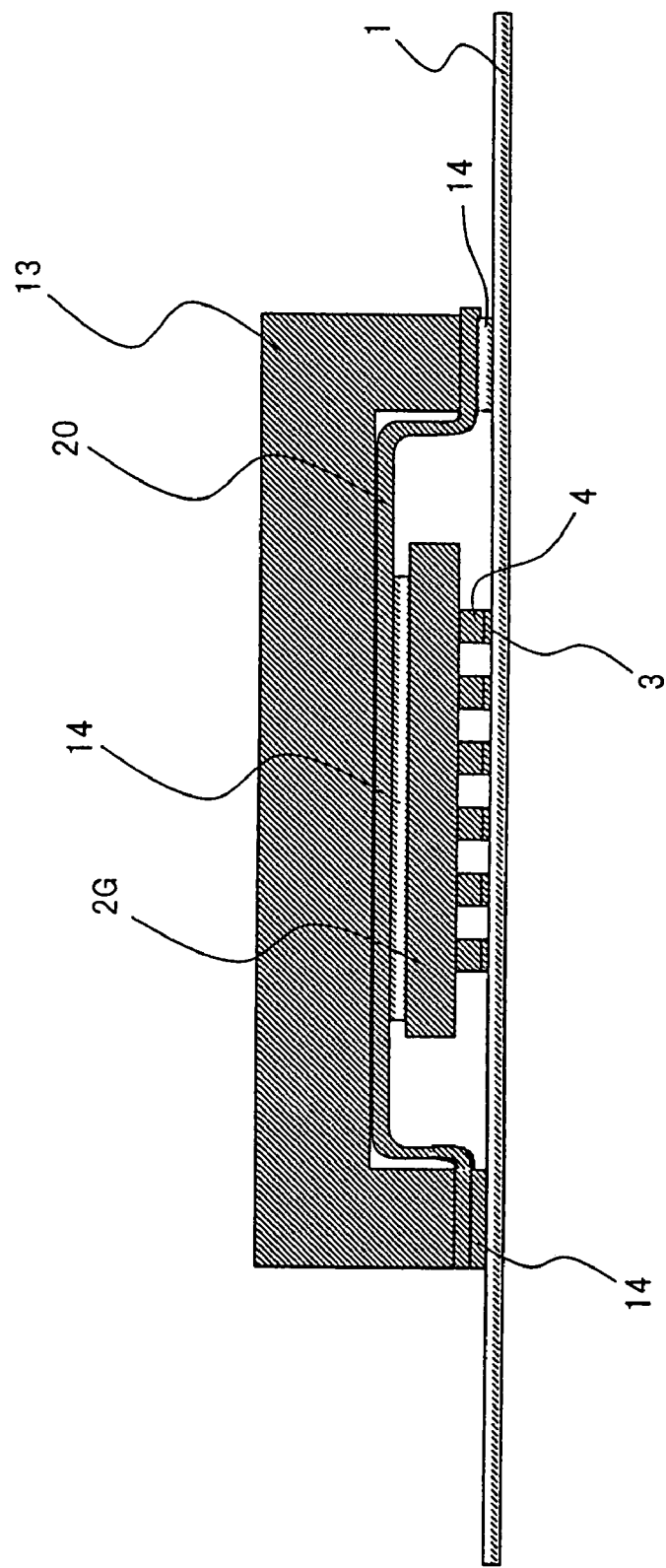
FIG. 19 is a view showing a state in which a sheet cover is placed on the top surface of a semiconductor element and is heat-pressed by a fixing jig in a process of manufacturing the semiconductor device in accordance with Embodiment 7.
Figure 20:
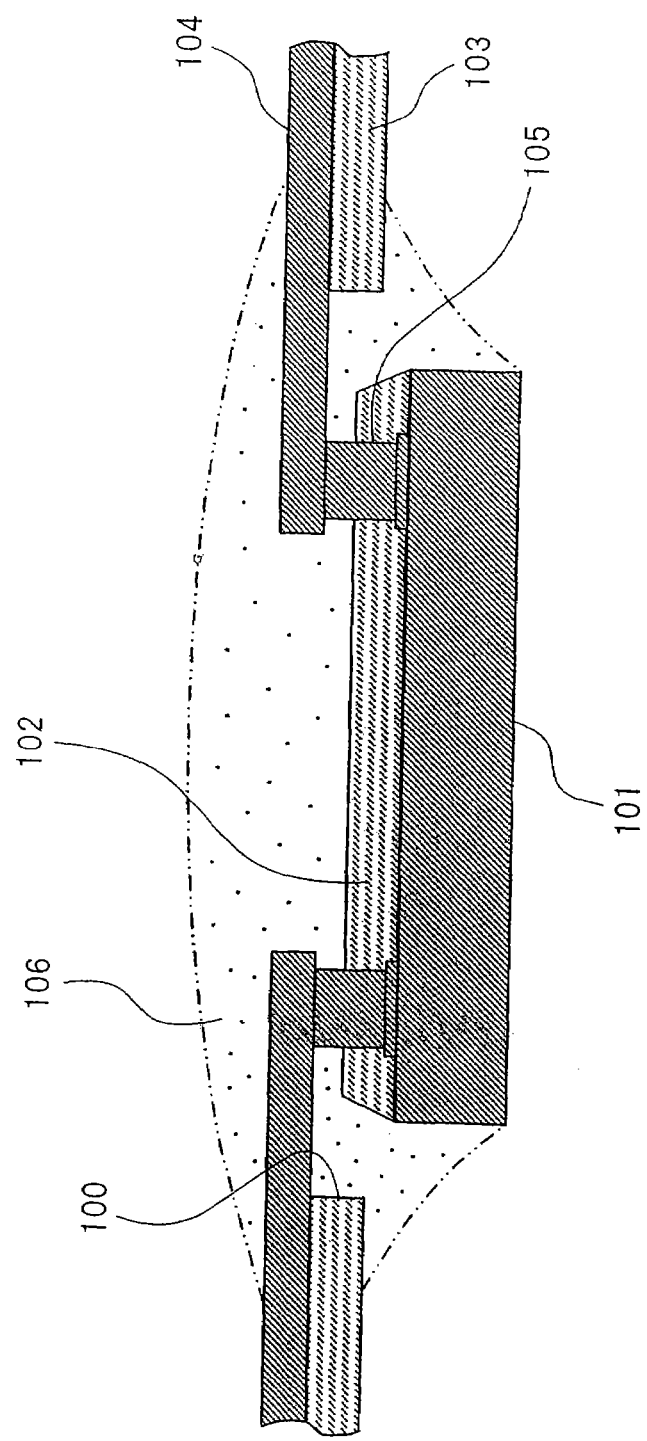
FIG. 20 is the cross-sectional view showing the configuration of the conventional semiconductor device.

In the manufacture of the semiconductor device in accordance with Embodiment 7, for example, the semiconductor element 2G described in Embodiments 1 to 6 mentioned above is placed on the film substrate 1 having the electrodes 3, heat-crimped, and thereby connected to the desired electrodes 3 via the bump electrodes 4. Subsequently, the sheet cover 20 is placed on the top surface of the semiconductor element 2G. The sheet cover placed as mentioned above is heat-pressed by the fixing jig 13. The state at this time is shown in FIG. 19. As shown in FIG. 19, an adhesive 14 is applied between the fixation portion of the sheet cover 20 and the film substrate 1. In the semiconductor device in accordance with Embodiment 7, the sheet cover 20 is fixed to the film substrate 1 at both ends in the longitudinal direction of the semiconductor element 2G by the adhesive 14.

After the sheet cover 20 is fixed to a desired position with respect to the semiconductor element 2G as mentioned above, the resin is injected from a portion along the length of the sheet cover 20 into the inside on the longer sides of the semiconductor element 2G so as to cover the junctions of the bump electrodes 4 of the semiconductor element 2G and the electrodes 3. The resin is injected, and the sealing part 6 is thereby formed.

In Embodiment 7, since the sheet cover 20 is provided, even when the film substrate 1 is bent in the manufacturing process, the contact of the semiconductor element 2G with the electrodes 3 of the film substrate 1 hardly occurs, and even when it occurs, it is not such a harsh contact as to have an impact. Consequently, when the semiconductor device is manufactured, the electrodes 3 are prevented from getting scratched by the contact, and a high-reliability semiconductor device can be provided.

In addition, since the sheet cover 20 has the electromagnetic shield effect, the performance of the products using the semiconductor device in accordance with Embodiment 7 can be further improved.

Incidentally, as a material of the sheet cover 20, a film-shaped insulating resin is preferable, and the material which is the same as that of the film substrate 1 can also be used. However, when a film having more flexibility than the film substrate 1 is used as the material of the sheet cover 20, the bent in the film substrate 1 is smooth, and the versatility with respect to products is expanded.

In the case where the material of the sheet cover 20 is the same as that of the film substrate 1, it is recommendable to use the material of a thinner thickness as the material of the sheet cover 20 so that the sheet cover 20 may have flexibility. For example, when the film substrate 1 has a thickness of 80 μm, it is preferable that the thickness of the sheet cover 20 be equal to or less than two-thirds the thickness thereof. When the thickness of the sheet cover 20 is especially preferably about 40 μm, which is equal to or less than half the thickness thereof, the bent in the film substrate 1 is smooth, and the contact of the semiconductor element 2G with the electrodes 3 of the film substrate 1 hardly occurs, and even when it occurs, it is not such a harsh contact to scratch the electrode 3.

Furthermore, when the material of the film substrate 1 is polyimide, it is preferable to select a flexible sheet material such as polyethylene as the material of the sheet cover 20. However, when there is a limit due to a characteristic such as a heat resisting property, it is desirable to use a film of the same kind, which is thinner as mentioned above.

Incidentally, the shape of the sheet cover 20 needs to be larger than that of the semiconductor element 2G, but when the direction in which the film substrate 1 bends is decided in advance, the sheet cover 20 is made to have a shape which is larger only in the direction than that of the semiconductor element 2G and configured so as to fix at both ends in the direction.

Furthermore, the sheet cover may be provided so as to cover the portions including the corner parts of the semiconductor element 2G. In addition, when a plurality of semiconductor elements 2G are mounted, it is possible not only to place the sheet covers one on each of them, but also to place a single sheet cover on all the semiconductor elements. In consideration of the manufacturing cost and the like, the sheet covers may be placed only on necessary semiconductor elements.

As a method for fixing the sheet cover 20, a method in which a sheet-shaped thing coated with an adhesive in advance is cut into a desired shape, and stuck to the top surface of the semiconductor element from above may be carried out. Alternatively, an adhesive is applied to desired positions of the top surface of the semiconductor element and the film substrate in advance, and the cut sheet cover 20 is stuck thereto from above.

As is apparent from the detailed description in each embodiment as mentioned above, according to the present invention, the contact of the electrode formed on the film substrate with the edge parts of the semiconductor element when the semiconductor element is mounted thereon can be reliably prevented, and the resin molding can be performed with reliability and high precision on the semiconductor element mounted on the film substrate. Furthermore, the present invention is intended to provide a high-versatility semiconductor device and a manufacturing method thereof which can be applied to a high-density mounting substrate.

Although the present invention has been described with respect to its preferred embodiments in some detail, the disclosed contents of the preferred embodiments may change in the details of the structure thereof, and any changes in the combination and sequence of the components may be attained without departing from the spirit and scope of the claimed invention.

The invention claimed is:

1. A semiconductor device comprising:
   a flexible film substrate formed of a flexible resin material;
   electrodes formed on at least one surface of said flexible film substrate and composed of an electrode pattern of a metal film;
   a semiconductor element having bump electrodes connected to said electrodes;
   an electrically insulating protection part formed only on a surface of said semiconductor element adjacent the entire outer lateral edges of the surface and formed only laterally outside of said bump electrodes to circumscribe said bump electrodes, the protection part being in contact with the outer lateral edge, such that the protection part prevents a direct contact of said semiconductor element with said electrode pattern; and
   a sealing part which is at least formed in the space between said semiconductor element and said flexible film substrate and seals said electrodes and said bump electrodes.

2. A semiconductor device in accordance with claim 1, wherein the surface of the electrically insulating protection part and the surface of said flexible film substrate forms at least a 10 μm gap.

3. A semiconductor device in accordance with claim 1, wherein the electrically insulating protection part is formed to have a thickness in a range of 1 to 5 μm.

4. A semiconductor device in accordance with claim 1, wherein the electrically insulating protection part is formed to have a curved surface opposed to said flexible film substrate.

5. A semiconductor device in accordance with claim 1, wherein a sheet cover formed of a flexible resin material is provided on said semiconductor element in a state of sticking fast thereto.

6. A semiconductor device in accordance with claim 5, wherein said sheet cover is formed of a material having an electromagnetic shield effect.

7. A semiconductor device in accordance with claim 1, wherein the plane shape of said semiconductor element is rectangular, and wherein a sheet cover formed of a flexible resin material covers the shorter sides of said semiconductor element, and is fixed to said flexible film substrate in such a manner as to leave the longer sides open.

8. A semiconductor device comprising:
   a flexible film substrate formed of a flexible resin material;
   electrodes formed on at least one surface of said flexible film substrate and composed of an electrode pattern of a metal film;
   a semiconductor element having bump electrodes connected to said electrodes;
   an electrically insulating protection part composed of only an electrically insulating resin, which is formed only on a surface of said semiconductor element adjacent the entire outer lateral edges of the surface and formed only laterally outside of said bump electrodes to circumscribe said bump electrodes, the protection part being in contact with the outer lateral edge, such that the protection part prevents a direct contact of said semiconductor element with said electrode pattern; and
   a sealing part which is at least formed in the space between said semiconductor element and said flexible film substrate and seals said electrodes and said bump electrodes.

* * * * *

UNITED STATES PATENT AND TRADEMARK OFFICE
CERTIFICATE OF CORRECTION

| | | |
|---|---|---|
| PATENT NO. | : 7,646,095 B2 | Page 1 of 1 |
| APPLICATION NO. | : 10/946372 | |
| DATED | : January 12, 2010 | |
| INVENTOR(S) | : Higashi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 376 days.

Signed and Sealed this

Sixteenth Day of November, 2010

David J. Kappos
*Director of the United States Patent and Trademark Office*